United States Patent
Kim et al.

[19]

[11] Patent Number: 5,912,899
[45] Date of Patent: Jun. 15, 1999

[54] MERGED DATA MEMORY TESTING CIRCUITS AND RELATED METHODS WHICH PROVIDE DIFFERENT DATA VALUES ON MERGED DATA LINES

[75] Inventors: Tae-Yun Kim; Hyun-Sung Hwang, both of Kyungki-do, Rep. of Korea

[73] Assignee: Samsung Electronics Co., Ltd., Rep. of Korea

[21] Appl. No.: 08/772,696

[22] Filed: Dec. 23, 1996

[30]     Foreign Application Priority Data

Dec. 22, 1995 [KR]  Rep. of Korea ....................... 95-54751

[51] Int. Cl.⁶ .................................................. G01R 31/28
[52] U.S. Cl. .......................................... 371/21.1; 365/201
[58] Field of Search .................................. 371/21.1, 22.5, 371/27.1, 27.5, 27.6; 395/183.06, 183.18, 183.19; 365/201, 189.05, 189.07, 189.02, 230.06, 230.02, 205

[56]                References Cited

U.S. PATENT DOCUMENTS

| | | | |
|---|---|---|---|
| 5,440,522 | 8/1995 | Hirano | 365/230.03 |
| 5,483,493 | 1/1996 | Shin | 365/201 |
| 5,537,351 | 7/1996 | Suwa et al. | 365/189.02 |
| 5,548,596 | 8/1996 | Tobita | 371/21.2 |
| 5,654,924 | 8/1997 | Suzuki et al. | 365/189.05 |
| 5,696,720 | 12/1997 | Lee | 365/189.05 |
| 5,715,210 | 2/1998 | Yoo et al. | 365/230.06 |

*Primary Examiner*—Robert W. Beausoliel, Jr.
*Assistant Examiner*—Nadeem Iqbal
*Attorney, Agent, or Firm*—Myers Bigel Sibley & Sajovec

[57]                ABSTRACT

An integrated circuit memory device includes first and second input buffers, and first and second input bus lines corresponding to the first and second input buffers. The first input buffer is connected to the first input bus line while a transfer gate is provided between the second input buffer and the second input bus line. The transfer gate connects the second input buffer with the second input bus line during a data input-output operation and disconnects the second input buffer from the second input bus line during a memory test operation. A coupling circuit couples the first and second input bus lines during the memory test operation so that a data value from the first input bus line is inverted and applied to the second input bus line responsive to a first value of an address buffer output during the memory test operation. The data value from the first input line is applied to the second input bus line without inversion responsive to a second value of the address buffer output during the memory test operation. Furthermore, a coupling circuit isolates the first and second input bus lines during the data input-output operation.

19 Claims, 11 Drawing Sheets

| ADDRESS KEY | | | DIN(0~3) AT TIME OF MDQ | | | |
|---|---|---|---|---|---|---|
| MA2 | MA1 | MA0 | DI3 | DI2 | DI1 | DI0 |
| 0 | 0 | 0 | 0 | 0 | 1 | 0 |
| 0 | 0 | 1 | 0 | 0 | 0 | 0 |
| 0 | 1 | 0 | 0 | 1 | 1 | 0 |
| 0 | 1 | 1 | 0 | 1 | 0 | 0 |
| 1 | 0 | 0 | 1 | 0 | 1 | 0 |
| 1 | 0 | 1 | 1 | 0 | 0 | 0 |
| 1 | 1 | 0 | 1 | 1 | 1 | 0 |
| 1 | 1 | 1 | 1 | 1 | 0 | 0 |
| 0 | 0 | 0 | 1 | 1 | 1 | 1 |
| 0 | 0 | 1 | 1 | 1 | 0 | 1 |
| 0 | 1 | 0 | 1 | 0 | 1 | 1 |
| 0 | 1 | 1 | 1 | 0 | 0 | 1 |
| 1 | 0 | 0 | 0 | 1 | 1 | 1 |
| 1 | 0 | 1 | 0 | 1 | 0 | 1 |
| 1 | 1 | 0 | 0 | 0 | 1 | 1 |
| 1 | 1 | 1 | 0 | 0 | 0 | 1 |

FIG. 9

MERGED DATA MEMORY TESTING CIRCUITS AND RELATED METHODS WHICH PROVIDE DIFFERENT DATA VALUES ON MERGED DATA LINES

FIELD OF THE INVENTION

The present invention relates to the field of integrated circuits and more particularly to integrated circuit memory devices.

BACKGROUND OF THE INVENTION

Conventional tests for multi-bit memory devices have been modified by connecting several data input pins. Accordingly, the time required to test the memory device can be reduced because multiple data inputs can be tested simultaneously. In particular, these memory devices include a circuit allowing data from a single data input buffer to be provided to a plurality of data input bus lines during a memory test operation. The number of input-output pins needed to test the memory device can thus be reduced because one input-output pin can be used to provide data input to multiple data input bus lines. Because the input bus lines connected to the common input pin will have the same data input, a common data pattern is used during the test.

FIG. 1 is a circuit diagram of a merge data input circuit according to the prior art. As shown, this circuit includes data input buffers 3, 5, 7, and 9; data input bus lines 100, 200, 300, and 400; transfer gates 21, 23, 25, 27, 29, and 31; and merge data output signal generator 11. Each of the data input bus lines is connected to a respective data input buffer to which data inputs DI0, DI1, DI2, and DI3 are provided. The transfer gates 21, 23, and 25 control the connection between input bus lines 200, 300, and 400 and the data input buffers 5, 7, and 9. The transfer gates 27, 29, and 31 control the connections between the data input bus line 100 and the data input bus lines 200, 300, and 400. The merge data output signal generator 11 is connected to the transfer gates thus controlling the data provided to the data input bus lines 200, 300, and 400.

FIG. 2 is a circuit diagram illustrating a merge data output circuit according to the prior art. As shown, this circuit includes data output bus lines 500, 600, 700, and 800; an exclusive NOR gate 33; NAND gate 35; and switching units 37 and 39. Each of the data output bus lines connects a respective data signal DO0, DO1, DO2, and DO3 with a respective data output buffer 51, 53, 55, and 57. Each input of the exclusive NOR gate 33 is connected to a respective data output bus line so that the NOR gate performs an exclusive NOR operation with the data DO0, DO1, DO2, and DO3. The merge data output signal MDQ and the output of the exclusive NOR gate are provided to the inputs of the NAND gate 35. The switching unit 37 is provided to connect the data output bus line 500 with the data output buffer under the control of the merge data output signal MDQ. The switching unit 39 is connected in parallel with the switching unit 37 to connect the data output bus line 500 with the data output buffer 51 in response to the output of the NAND gate 35.

The circuits of FIGS. 1 and 2 may reduce the time required to test a memory device because multiple input and output data bus lines can be tested simultaneously using a single input pin and a single output pin. Faults caused by shorts between the data input bus lines or between the data output bus lines may go undetected, however, because each of these data lines is tested using a common data value. Accordingly, faults caused by shorts between data bus lines may go undetected until a test of the packaged memory device can be performed after fabrication, thereby increasing the costs of testing. Furthermore, the memory test circuits discussed above may be unable to provide a fail point screen according to a data pattern.

SUMMARY OF THE INVENTION

It is therefore an object of the present invention to provide improved circuits and methods for testing integrated circuit memory devices.

It is another object of the present invention to provide test circuits and methods which can detect electrical shorts between data bus lines.

These and other objects are provided according to the present invention by integrated circuit memory devices including first and second input buffers and first and second input bus lines corresponding to the first and second input buffers. The first input buffer is connected to the first input bus line while a transfer gate is provided between the second input buffer and the second input bus line. This transfer gate connects the second input buffer with the second input bus line during a data input-output operation and disconnects the second input buffer from the second input bus line during a memory test operation. A coupling circuit couples the first and second input bus lines during the memory test operation so that a data value from the first input bus line is inverted and applied to the second input bus line responsive to a first value of an address buffer output during the memory test operation. The data value from the first input line is applied to the second input bus line through the coupling circuit without inversion responsive to a second value of the address buffer output during the memory test operation. Furthermore, the coupling circuit isolates the first and second input bus lines during the data input-output operation.

Accordingly, a single data input through a single input buffer can be used to provide different data values to a plurality of data bus lines simultaneously during a memory test operation. The time required to test the memory device can thus be reduced while still detecting shorts between data bus lines.

The integrated circuit memory device can also include first and second output bus lines corresponding to the first and second input bus lines, and first and second output buffers corresponding to the respective first and second output bus lines. An output transfer gate connects the first output bus line with the first output buffer during the data input-output operation and disconnects the first output bus line from the first output buffer during the memory test operation. A decoding circuit generates a decoded output signal at the first output buffer during the memory test operation responsive to a data value of the first output bus line, a data value of the second output bus line, and a value of the address buffer output. Accordingly, the plurality of data input and output bus lines can be tested simultaneously with different data values applied to different data bus lines.

The integrated circuit memory device can also include a third input buffer and a third input bus line corresponding to third input buffer. The transfer gate connects the third input buffer with the third input bus line during the data input-output operation and disconnects the third input buffer from the third input bus line during the memory test operation. Furthermore, the coupling circuit can couple the first and third input bus lines during the memory test operation so that a data value from the first input bus line is inverted and applied to the third input bus line responsive to a first value of a second address buffer output during the memory test operation. The data value from the first input bus line can be applied to the third input bus line without inversion responsive to a second value of the second address buffer output during the memory test operation. The coupling circuit isolates the first and third input bus lines during the data input-output operation.

According to another aspect of the present invention, a method for testing an integrated circuit memory device having a plurality of bus lines includes the steps of connecting a first one of the input bus lines to a first input buffer, and disconnecting a second one of said input bus lines from a second input buffer during a memory test operation. The first and second input bus lines are coupled during the memory test operation so that a data value from the first input bus line is inverted and applied to the second input bus line responsive to a first value of an address buffer output during the memory test operation. The first and second input bus lines are coupled during the memory test operation so that the data value from the first input line is applied to the second input bus line without inversion responsive to a second value of the address buffer output during the memory test operation.

The memory circuits and methods of the present invention thus allow the simultaneous testing of a plurality of data bus lines of an integrated circuit memory device while still allowing detection of electrical shorts between data bus lines.

BRIEF DESCRIPTION OF THE DRAWINGS

FIG. 9 is a table illustrating a correlation between an address key and a data input during a merge data output test according to the present invention.

DETAILED DESCRIPTION

Figure 1:
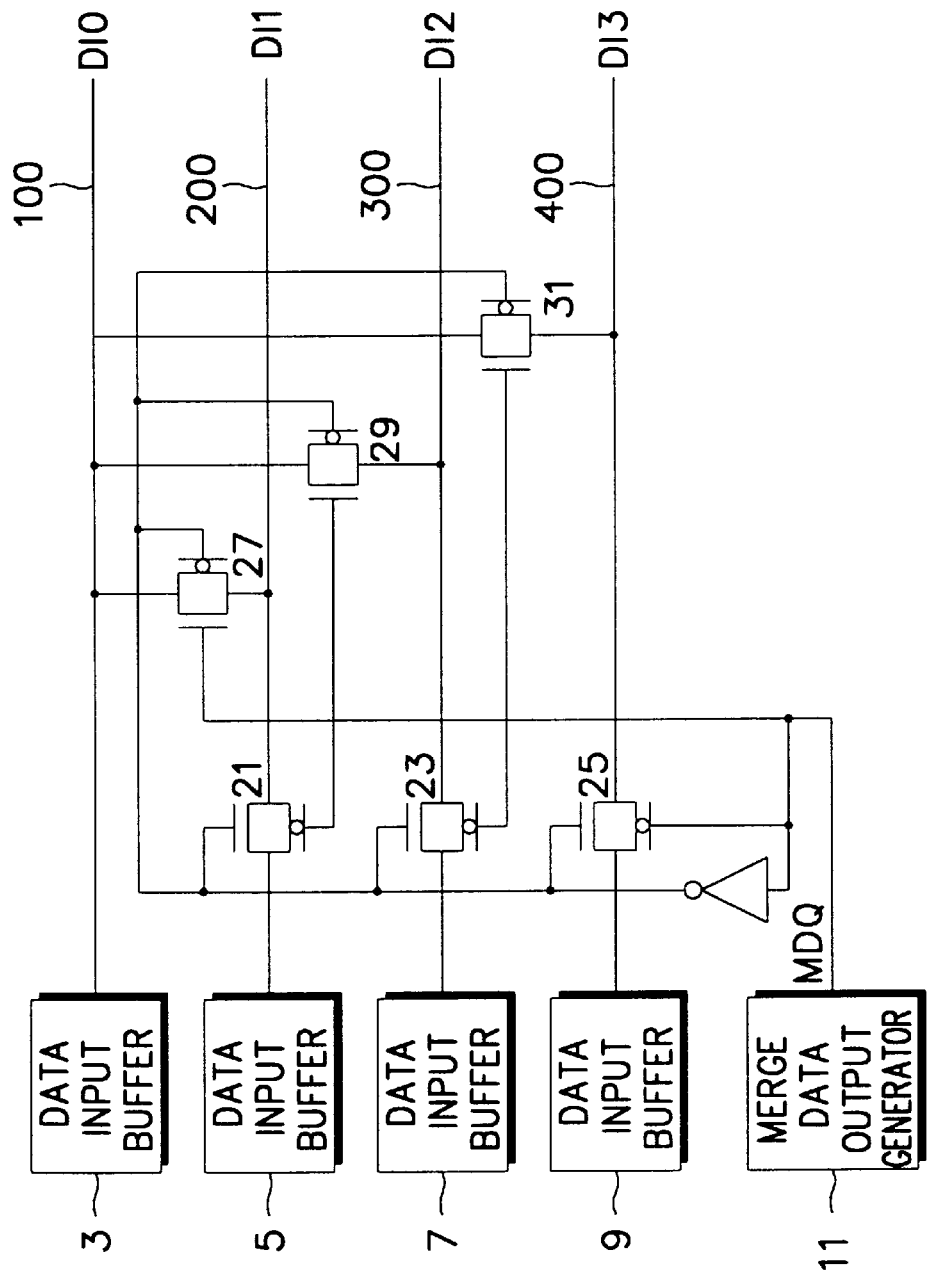
FIG. 1 is a circuit diagram illustrating a merge data input circuit according to the prior art.
Figure 2:
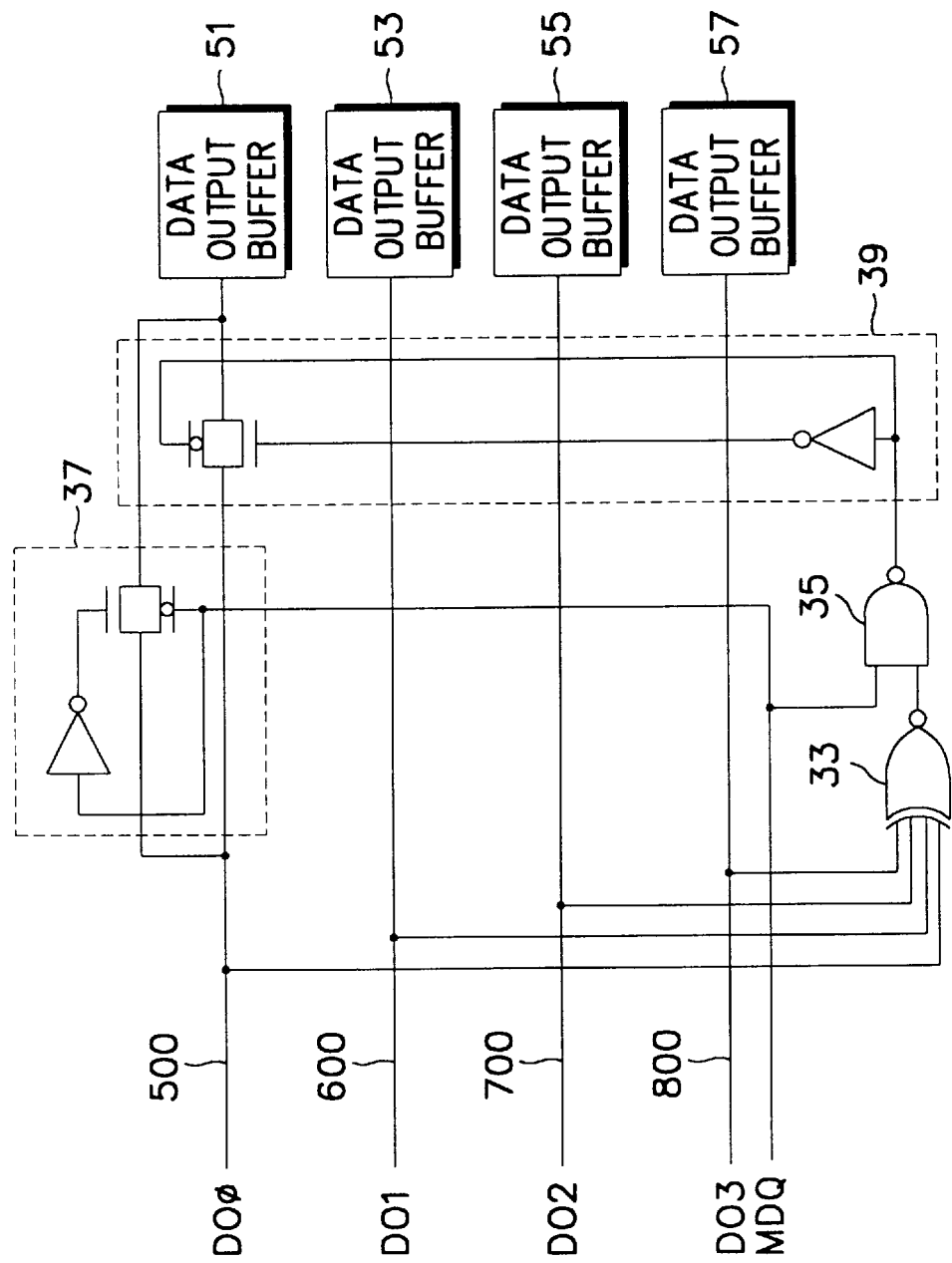
FIG. 2 is a circuit diagram illustrating a merge data output circuit according to the prior art.

The present invention will now be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

In the discussion that follows, the data is grouped in units of 4 bits and output as a 16 bit product. Accordingly, during input-output operations, 16 bits are written to and read from a memory device. During memory test operations, however, the memory device of the present invention generates 4 bits at a merge output test pin.

As shown in FIG. 3, the input circuit includes the data input buffers 3, 5, 7, and 9; the address buffers 150, 160, and 170; the data input bus lines 100, 200, 300, and 400; the transfer gates 21, 23, and 25; a merge data output control generator 20; a switching unit 120; and merge data output control units 27, 29, and 31. Each data input bus line is connected to a respective data input buffer and thus transfers a respective data input DI0, DI1, DI2, or DI3. The transfer gates 21, 23, and 25 are each connected between a data input buffer 5, 7, and 9, and a respective data input bus line 200, 300, and 400. The merge data output control generator 20 generates a merge data output signal MDQ which controls the transfer gates 21, 23, and 25. Accordingly, the merge data output control generator 20 controls the connection between the data input buffers 5, 7, and 9, and the respective data input bus lines 200, 300, and 400.

The switching unit 120 includes a plurality of transfer gates connected between the address buffers 150, 160, and 170, and the respective merge data output control units 27, 29, and 31. Each address buffer generates a respective merge address output signal MA0, MA1, and MA2 which is switched by a respective transfer gate of the switching unit 120. In particular, each transfer gate of the switching unit 120 is controlled by the merge data output control generator 20. The merge data output control units 27, 29, and 31 have inputs connected to the outputs of the switching unit 120 and the merge data output control generator 20.

During a data input operation, the data from the data input buffers 3, 5, 7, and 9 is provided to the respective data input bus lines. During a memory test operation, however, the data input DI0 of the first data input buffer 3 is provided to the first data input bus line 100, and the merge data output control units 27, 29, and 31 provide the data inputs DI1, DI2, and DI3 to the data input bus lines 200, 300, and 400. In particular, the address buffer outputs MA0, MA1, and MA2 together with the first data input buffer output DI0 determine the data values provided to the data input bus lines 200, 300, and 400 during the memory test operation.

Figure 8:
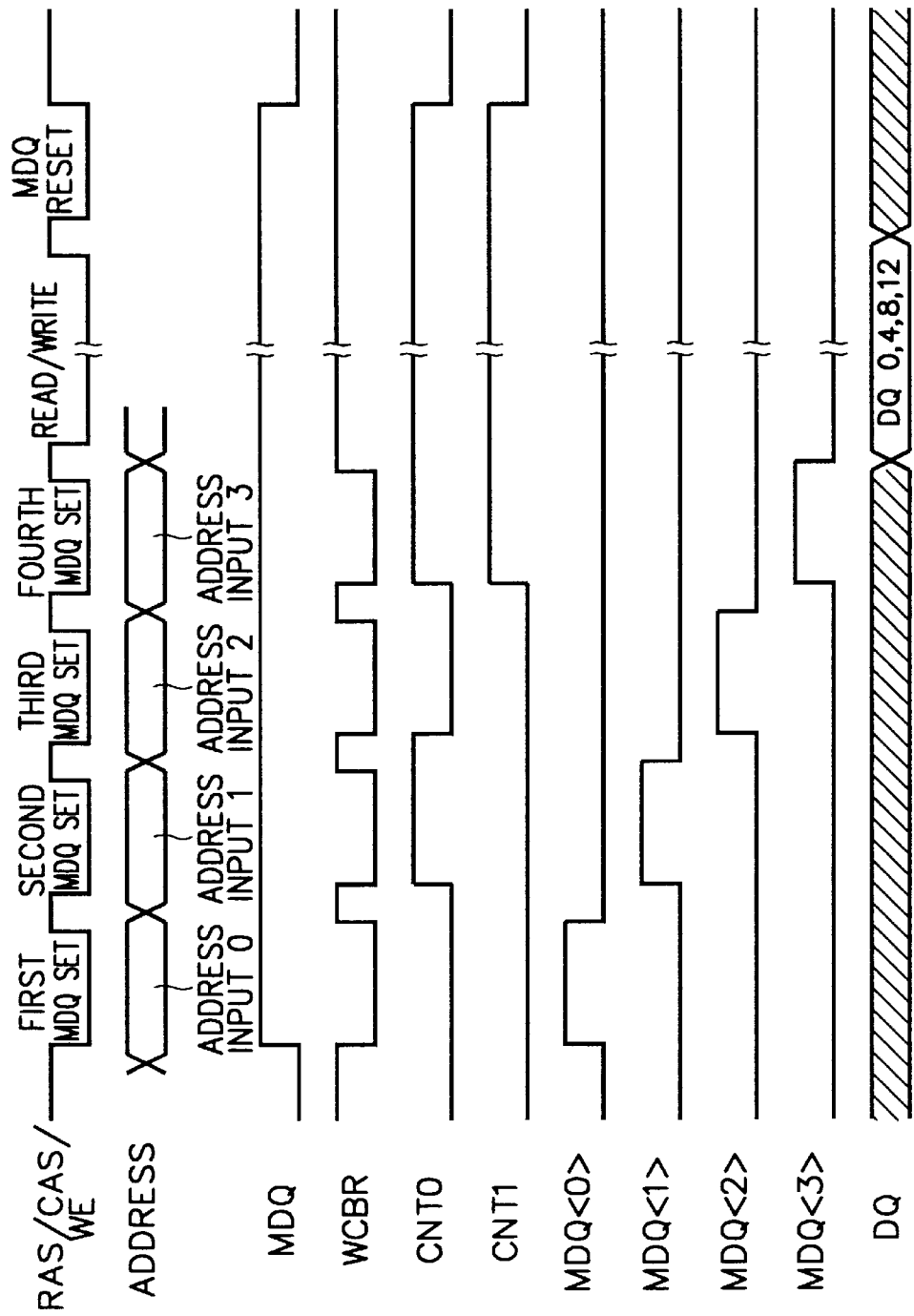
FIG. 8 is a timing diagram illustrating operation of a merge data output test according to the present invention.
Figure 4:
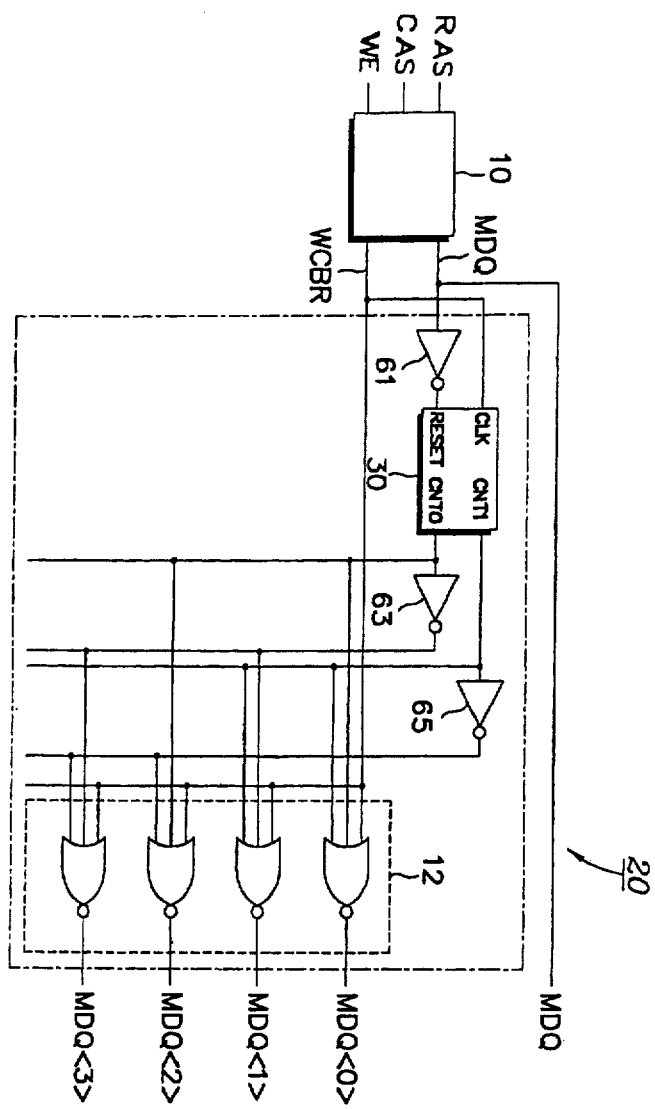

As shown in the timing diagram of FIG. 8, the output of the first data input buffer can be inverted or provided without inversion to each of the data input bus lines 200, 300, and 400 depending on the data value of the signal DI0 and the memory addresses MA0–2 during the MDQ set cycle (write CAS before RAS cycle or WCBR cycle). A table illustrating the relationships between the signals DI0, MA0, MA1, and MA2 and the data signals DI1, DI2, and DI3 are illustrated in FIG. 9. In other words, the output of the first data input buffer 3 is either provided directly (without inversion) to or inverted and provided to each of the data input bus lines 200, 300, and 400 during a memory test operation depending on the outputs MA0, MA1, and MA2 of the respective data address buffers 150, 160, and 170.

Accordingly, different data values can be provided to the data input bus lines 100, 200, 300, and 400 thus allowing the test to detect shorts between bus lines. Each of the merge data output control units 27, 29, and 31 includes common circuitry respectively connected between the data input bus lines 200, 300, and 400, and the first data input bus line 100. Each of the merge data output control units couples respective data lines either directly or through an inverter according to the state of the data address buffer outputs MA0–2 during a memory test operation.

Figure 4:
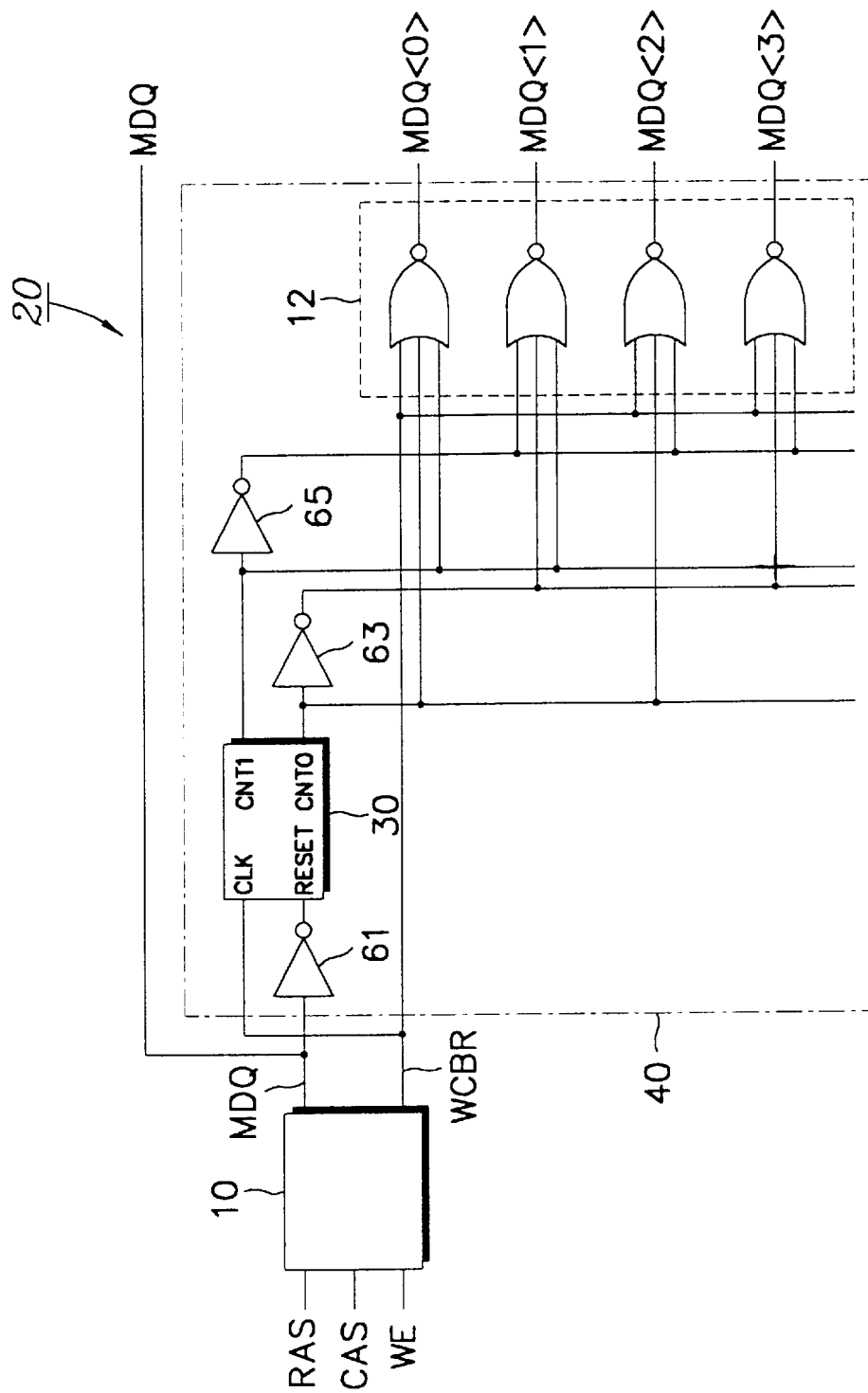
FIG. 4 is a circuit diagram illustrating a merge data output control generator according to FIG. 3.

As shown in FIG. 4, the merge data output control circuit 20 includes a merge data output signal generator 10, a counter 30, and a NOR gate circuit 12. The merge data output signal generator 10 generates the merge data output signal MDQ after receiving the row address strobe signal RAS, the column address strobe signal CAS, and the write enable signal WE. The merge data output signal generator also generates a signal WCBR which starts the WCBR mode. The counter 30 has an input connected to the output of the merge data output signal generator 10, and as shown, this counter performs a two bit binary counting operation. The NOR gate circuit includes a plurality of NOR gates which perform the NOR operation with the WCBR signal and the outputs of the counter 30 and the inverters 63 and 65.

Figure 5:
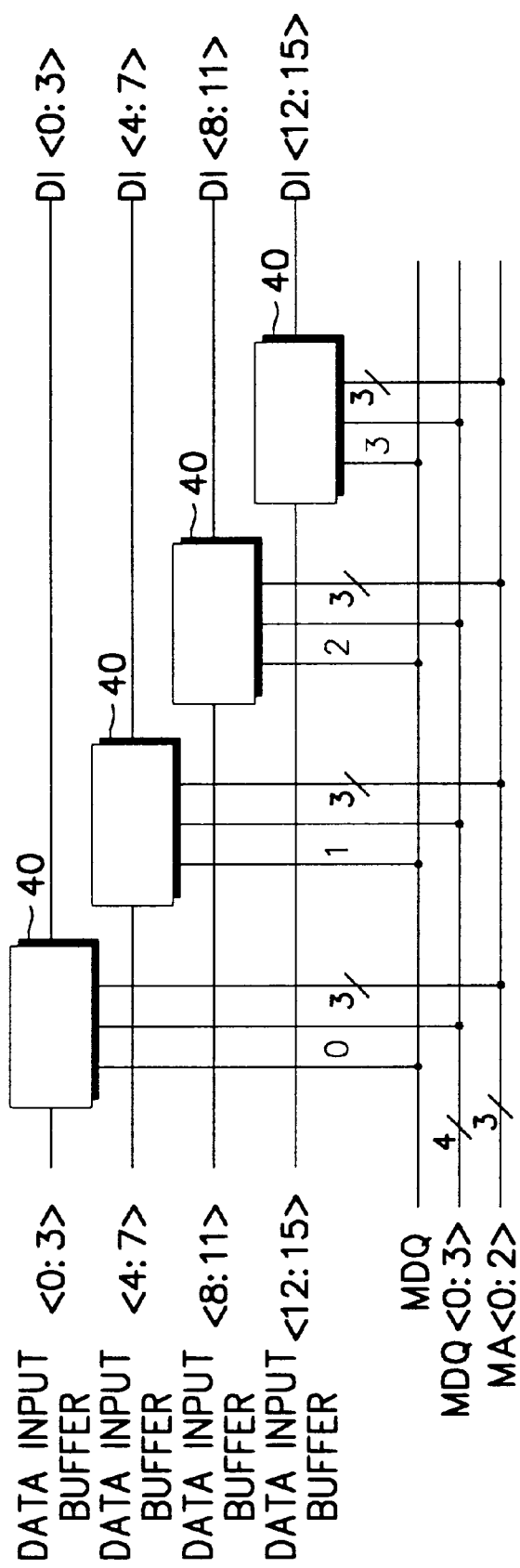
FIG. 5 is a block diagram of a data output signal control circuit according to FIGS. 3 and 4 providing 16 bit operation.

The merge data output MDQ control circuit of the merge data output control generator 20 determines which group of data input bus lines are controlled by the address buffer outputs MA0–2, as illustrated in FIG. 5. In particular, the input bus lines are divided into four groups of four bus lines each as follows: DI0–3, DI4–7, DI8–11, and DI12–15, and each of the control circuit outputs MDQ<0–3> selects a respective one of the input data bus line groups. As shown, the two bit binary counter 30 accommodates a memory device having 16 bus lines. For a memory device including 32 bus lines, a three bit counter can be used.

As shown in FIG. 8, the data DI0–3 is controlled during the first MDQ set cycle MDQ<0>, the data DI4–7 is controlled during the second set cycle MDQ<1>, the data DI8–11 is controlled during the third set cycle MDQ<2>, and data DI12–15 is controlled during the fourth set cycle MDQ<3>. In cases where a fifth MDQ set cycle is generated, the merge data output signal control circuit controls data DI0–3. The block diagram of FIG. 5 illustrates a 16 bit data input structure which provides conversion from normal 16 bit operation to 4 bit operation during MDQ memory test operation. The merge data output control circuit is the same as that illustrated in FIGS. 3 and 4.

FIG. 6 is a circuit diagram illustrating a merge data output test comparison circuit which allows testing of the four data output bus lines 500, 600, 700, and 800 during a MDQ memory test according to the present invention. This circuit includes data output bus lines 500, 600, 700, and 800; data output control circuits 50; transfer gates 71, 73, and 75; NAND gate 60; and switching units 37 and 39. Each of the data output lines connects a respective data output DO0–2 with a respective data output buffer 51, 53, 55, and 57. The data output control circuits 50 are each connected to the data output bus line 500 and to a respective one of the data output bus lines 600, 700, and 800. Each of the data output control circuits thus compares the data DO0 with one of DO1, DO2, or DO3 responsive to the respective memory address buffer output MA0–2 during a MDQ memory test operation.

Each of the transfer gates 71, 73, and 75 respectively switches a memory address buffer output MA0–2 to a data output control circuit 50 responsive to the first MDQ set cycle signal MDQ<0>. The NAND gate 60 includes inputs connected to the MDQ signal and the outputs of the output control circuits 50. The switching unit 37 is connected between the data output bus line 500 and the data output buffer 51, and this switching unit transfers the data output DO0 to the respective data output buffer 51 responsive to a low level of the MDQ signal. The switching unit 39 is connected in parallel with the switching unit 37, and this switching unit switches the data output DO0 to the data output buffer 51 responsive to the output of the NAND gate 60.

As shown, each of the data output control circuits 50 includes common circuit elements. Each data output control circuit compares one of the data outputs DO1–3 with the first data output DO0, and this comparison is made either directly or after inverting the respective data DO1–3 responsive to the respective address buffer output MA0–2. When each comparison made by the data output control circuits is true, the data DO0 is output through the switching unit 39 and the data output buffer 51. When the result of any one of these comparisons is false, the switching unit 39 is turned off and the output pin corresponding to the data output bus line 500 and data output buffer 51 is allowed to float electrically.

Figure 6A:
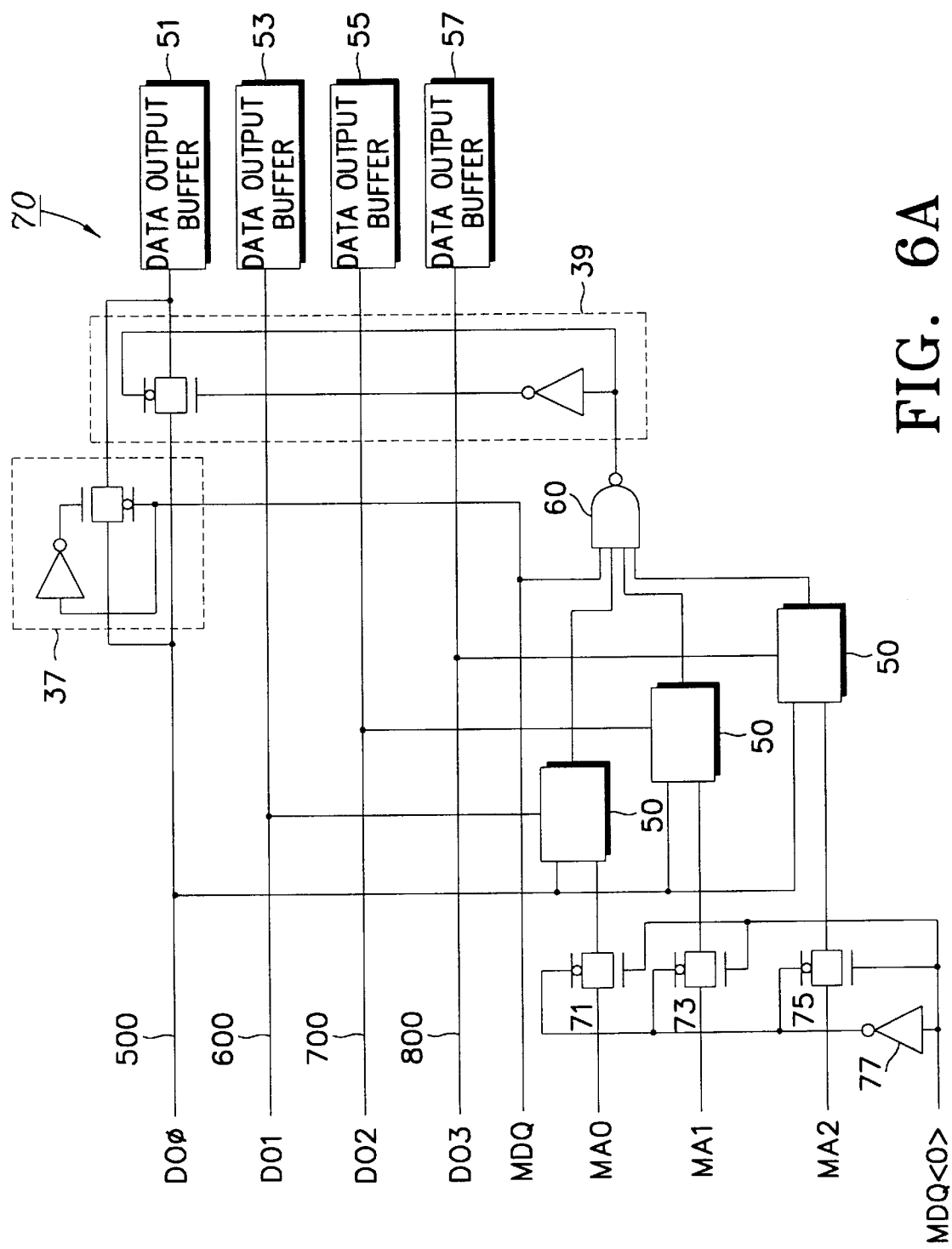
FIG. 6 is a circuit diagram illustrating a merge data output test comparison circuit according to the present invention.
Figure 6B:
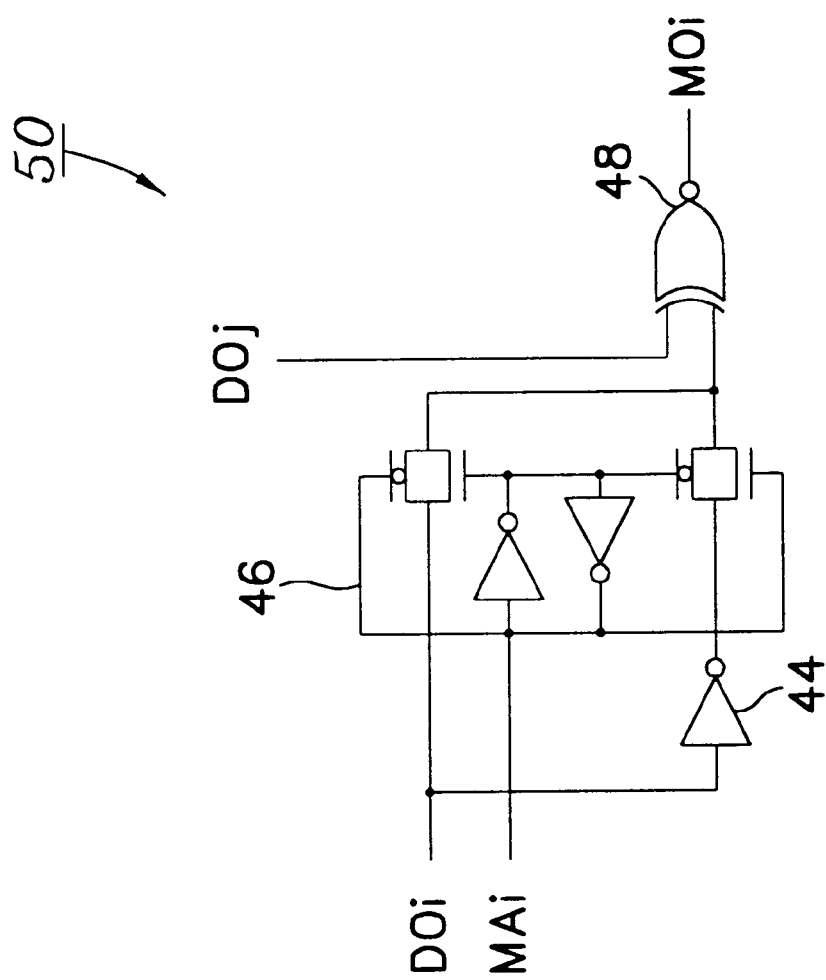
Figure 7:
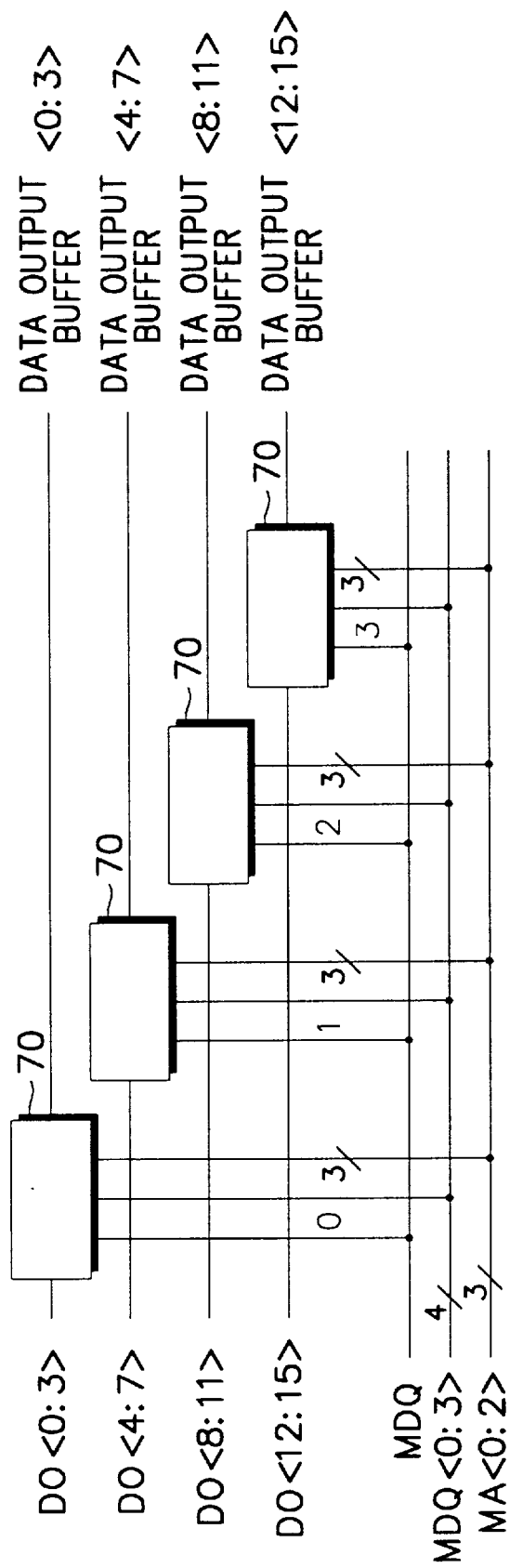
FIG. 7 is a block diagram illustrating a conversion of a 16 bit output to a 4 bit output according to the present invention.

FIG. 7 is a block diagram illustrating the conversion of a 16 bit output to a 4 bit output during a MDQ memory test operation according to the present invention. As shown, an MDQ memory test comparison circuit 70 is provided for each of four data outputs. The operation of each MDQ output test comparison circuits 70 is discussed above with reference to FIG. 6. A special MDQ set cycle is not required for the address buffer output signals MA0–2 and MDQ<0–3> during the output. Instead, the data values of the address buffer output signals MA0–2, which are latched at the initial MDQ set cycle, are utilized.

As shown in FIG. 8, the data inputs DI1–3 are decided according to the address buffer outputs MA0–2 and the data input DI0 at the first MDQ set cycle (WCBR cycle). The data values D15–7 are decided according to the address buffer outputs MA0–2 and the data input DI4 at the second set cycle. The data input values DI9–11 are decided according to the address buffer outputs MA0–2 and the data input DI8 at the third MDQ set cycle. The data input values DI13–15 are determined according to the address buffer output signals MA0–2 and data input DI12 at the fourth MDQ set cycle.

The WCBR signal is generated every MDQ set cycle, and the WCBR signal is provided to the two bit binary counter. In response to the WCBR signal, the binary counter generates the counter output signals CNT0 and CNT1. The signals MDQ<0–3> are sequentially generated in response to the counter output signals CNT0 and CNT1. During a memory test operation, the input state of data DI0, DI4, DI8, and DI12 are determined by the data inputs of the respective data input buffers. The input state of the remaining 12 data inputs are determined by the merge data output control units in response to the address buffer outputs MA0–2 and the values of data inputs DI0, DI4, DI8, and DI12. As shown in FIG. 9, the state of the data DI1–3 is determined according to the state of the memory address buffer outputs MA0–2 and the data input DI0. The test circuit of the present invention thus allows an integrated circuit memory device to input or output predetermined data according to the state of the memory address buffer outputs MA0–2 and the data input DI0 when performing a MDQ memory test thereby allowing the detection of failures caused by electrical shorts between data bus lines.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An integrated circuit memory device comprising:
   first and second input buffers;
   first and second input bus lines corresponding to said respective first and second input buffers, wherein said first input buffer is connected to said first input bus line;
   a transfer gate which connects said second input buffer with said second input bus line during a data input-output operation and which disconnects said second input buffer from said second input bus line during a memory test operation; and a coupling circuit which couples said first and second input bus lines during the memory test operation so that a data value from said first input bus line is inverted and applied to said second input bus line responsive to a first value of an address buffer output during the memory test operation and so that said data value from said first input line is applied to said second input bus line without inversion responsive to a second value of said address buffer output during the memory test operation, and wherein said coupling circuit isolates said first and second input bus lines during the data input-output operation.

2. An integrated circuit memory device according to claim 1 further comprising:

first and second output bus lines corresponding to said first and second input bus lines;

first and second output buffers corresponding to said respective first and second output bus lines;

an output transfer gate which connects said first output bus line with said first output buffer during the data input-output operation and which disconnects said first output bus line from said first output buffer during the memory test operation; and a decoding circuit which generates a decoded output signal at said first output buffer during the memory test operation responsive to a data value of said first output bus line, a data value of said second output bus line, and a value of said address buffer output.

3. An integrated circuit memory device according to claim 1 further comprising:

a third input buffer; and a third input bus line corresponding to said respective third input buffer, wherein said transfer gate connects said third input buffer with said third input bus line during the data input-output operation, and wherein said transfer gate disconnects said third input buffer from said third input bus line during the memory test operation.

4. An integrated circuit memory device according to claim 3 wherein said coupling circuit couples said first and third input bus lines during the memory test operation so that a data value from said first input bus line is inverted and applied to said third input bus line responsive to a first value of a second address buffer output during the memory test operation and so that said data value from said first input line is applied to said third input bus line without inversion responsive to a second value of said second address buffer output during the memory test operation, and wherein said coupling circuit isolates said first and third input bus lines during the data input-output operation.

5. A method for testing an integrated circuit memory device having a plurality of input bus lines, said method comprising the steps of:

connecting a first one of said input bus lines to a first input buffer;

disconnecting a second one of said input bus lines from a second input buffer during a memory test operation;

coupling said first and second input bus lines during the memory test operation so that a data value from said first input bus line is inverted and applied to said second input bus line responsive to a first value of an address buffer output during the memory test operation; and coupling said first and second input bus lines during the memory test operation so that said data value from said first input line is applied to said second input bus line without inversion responsive to a second value of said address buffer output during the memory test operation.

6. A method according to claim 5 further comprising the steps of:

connecting said second input bus line to said second input buffer during a data input-output operation; and isolating said first and second input bus lines during the data input-output operation.

7. A method according to claim 5 further comprising the steps of:

disconnecting an output bus line and a first output buffer during the memory test operation; and generating a decoded output signal at said first output buffer during the memory test operation responsive to a data value of said first output bus line, a data value of a second output bus line, and a data value of said address buffer output.

8. A method according to claim 5 further comprising the steps of:

disconnecting a third input bus line from a respective third input buffer during the memory test operation;

coupling said first and third input bus lines during the memory test operation so that a data value from said first input bus line is inverted and applied to said third input bus line responsive to a first value of a second address buffer output during the memory test operation; and coupling said first and third input bus lines during the memory test operation so that said data value from said first input line is applied to said third input bus line without inversion responsive to a second value of said second address buffer output during the memory test operation.

9. A merge data output mode selecting method for testing united data input or output bus lines when data is input or output through data input or output buffers in case of testing a memory cell or wafer having fault, in a semiconductor memory device, the method comprising the steps of:

(a) outputting as many data input signals as those output from the data input buffers after controlling output of a predetermined number of the data input buffers according to output of a predetermined number of address buffers and the counter of a merge data output control generator, during a normal operation; and (b) outputting the data input signals after uniting the output of the data input buffers in unit of a predetermined number of bits after controlling the output of the predetermined number of the data input buffers according to the output of the predetermined number of the address buffers and the output of the counter of the merge data output control generator, during a test.

10. The method according to claim 9, wherein the predetermined number of bits is variably plural according to the number of operation bits output from the data input buffer.

11. The method according to claim 9, wherein the predetermined number of bits is four bits of binary digits in case of 16-bit operation test.

12. The method according to claim 9, wherein the predetermined number of bits is three bits of binary digits in case of 32-bit operation test.

13. The method according to claim 9, wherein each data input signal transferred through the data input bus line, is selectively output through each data input buffer according to a merge data output cycling in the procedures (a) and (b).

14. A merge data output mode selecting method for testing united data input or output bus lines when data is input or output through data input or output buffers in case of testing a memory cell or wafer having fault, in a semiconductor memory device, the method comprising the steps of:

controlling an output of first piece of data among predetermined number of data outputs according to a merge data output signal;

selecting a predetermined address key input through switching means for switching the address key inputs under a control of first merge data output signal;

generating a predetermined number of output signals through each data output control circuit controlled by the first data output, the selected address key input, and data output signals except the first data output; and outputting the data output after merging them, or outputting it individually, into the data output buffers after performing logic operation with the output signals generated at the above step and controlling the first data output.

15. The method according to claim 14, wherein the predetermined number of bits is variable to be plurality according to the number of operation bits output from the data input buffer.

16. The method according to claim 14, wherein the predetermined number of bits is four bits of binary digits in case of 16-bit operation test.

17. The method according to claim 14, wherein the predetermined number of bits is three bits of binary digits in case of 32-bit operation test.

18. The method according to claim 14, wherein each data input signal transferred through the data input bus line, is selectively output through each data input buffer according to a merge data output cycling in the procedures (a) and (b).

19. A merge data output mode selecting method for testing united data input and output bus lines when data is input and output through data input and output buffers when testing an integrated circuit memory device, said method comprising the steps of:

generating a plurality of data input signals from of a respective plurality of data input buffers wherein each of said data input signals is applied to a respective data input bus line during a data input-output operation; and generating a first test data input signal from a first one of said data input buffers and applying said test data input signal to a respective first data input bus line during a memory test operation; and generating a plurality of secondary test data input signals which are applied to said data input bus lines other than said first data input bus line during the memory test operation, wherein each of said secondary test data input signals is generated responsive to said first test data input signal, a merge data test signal, and a respective address buffer output signal.

* * * * *

UNITED STATES PATENT AND TRADEMARK OFFICE
CERTIFICATE OF CORRECTION

PATENT NO. : 5,912,899                          Page 1 of 2

DATED : June 15, 1999

INVENTOR(S) : Tae-Yun Kim et al.

Figure 3A:
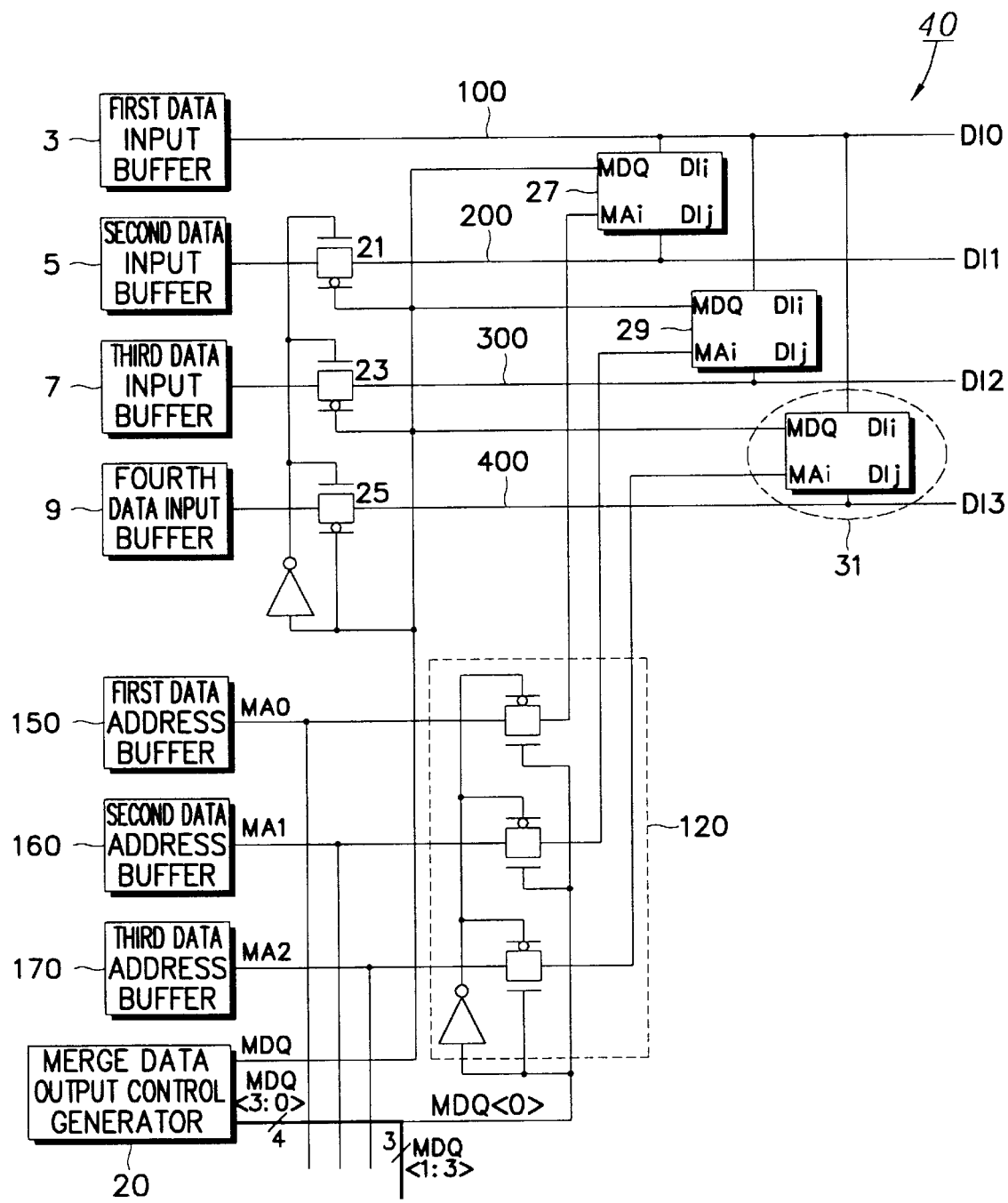
FIG. 3 is a circuit diagram illustrating a merge data test circuit for receiving merge data test inputs according to the present invention.
Figure 3B:
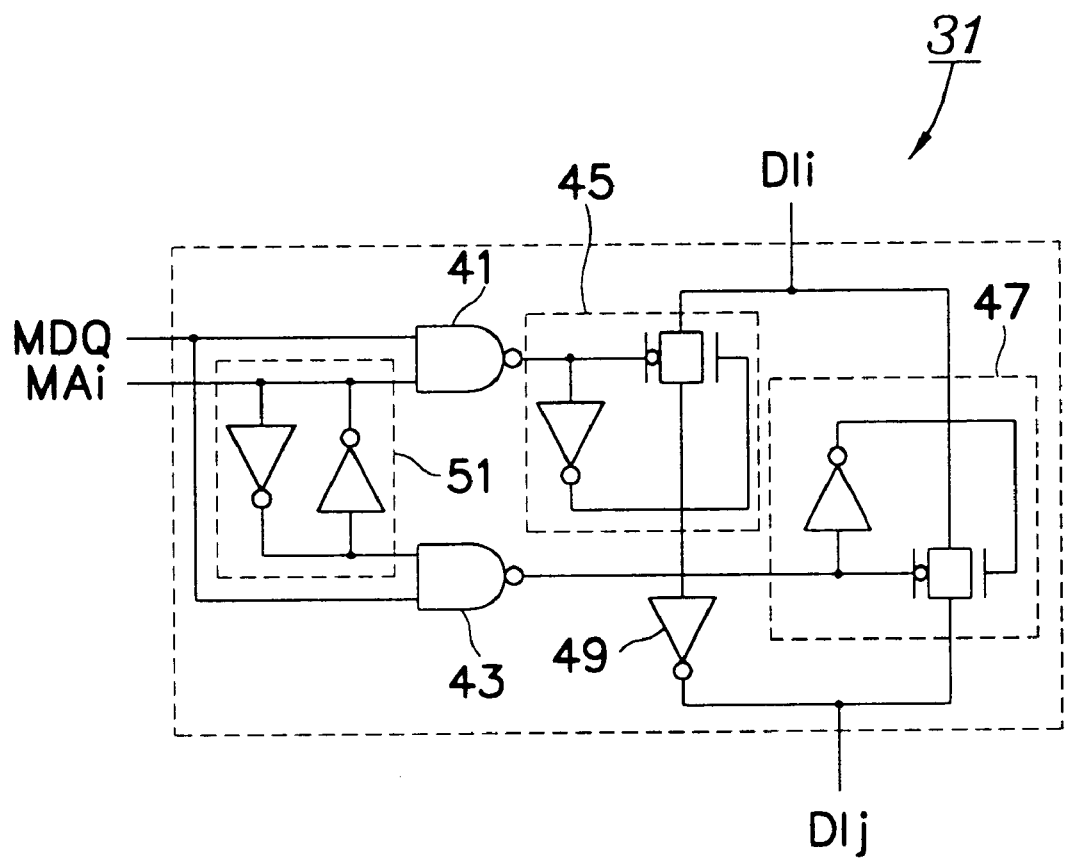

It is certified that error appears in the above-indentified patent and that said Letters Patent is hereby corrected as shown below:

In the Specification:
   Column 3, line 35 should read:
   "FIG. 3A and 3B are circuit diagrams illustrating a merge data test"
   Column 3, line 44 should read:
   "FIG. 6A and 6B are circuit diagrams illustrating a merge data output"
   Column 4, line 5 should read:
   "As shown in FIG. 3A and 3B, the input circuit includes the data"
   Column 5, line 37 should read:
   "FIG. 6A and 6B are circuit diagrams illustrating a merge data output"
   Column 6, line 17 should read:
   "reference to FIG. 6A and 6B. A special MDQ set cycle is not required"

In the Drawings:
   Sheet 5 (Figure 4) should appear as per the attached sheet of drawings.

Signed and Sealed this

Twenty-second Day of May, 2001

Attest:

NICHOLAS P. GODICI

Attesting Officer          Acting Director of the United States Patent and Trademark Office